United States Patent [19]

Chin

[11] 3,911,428

[45] Oct. 7, 1975

[54] DECODE CIRCUIT

[75] Inventor: William Benedict Chin, Wappingers Falls, N.Y.

[73] Assignee: International Business Machines Corporation, Armonk, N.Y.

[22] Filed: Oct. 18, 1973

[21] Appl. No.: 407,681

[52] U.S. Cl. .......... 340/347 DD; 307/205; 307/218; 307/251

[51] Int. Cl.[2] .......................................... H03K 13/24

[58] Field of Search ...... 340/347 DD; 307/205, 218, 307/251

[56] References Cited

UNITED STATES PATENTS

| | | | |
|---|---|---|---|
| 3,395,291 | 7/1968 | Bogert | 307/251 X |
| 3,551,693 | 12/1970 | Burns et al. | 307/251 |
| 3,601,627 | 8/1971 | Booher | 307/218 |
| 3,651,342 | 3/1972 | Dingwall | 307/251 |
| 3,659,118 | 4/1972 | Meyer | 307/251 |
| 3,717,868 | 2/1973 | Crawford | 340/347 DD |

*Primary Examiner*—Charles D. Miller
*Attorney, Agent, or Firm*—Thomas F. Galvin

[57] ABSTRACT

A decode circuit for use in a decoder employing switches such as complementary metal oxide semiconductor (CMOS) field effect transistors, utilizing cascaded (series-connected) switches of one channel type and a pair of cascoded (parallel-connected) switches of the opposite channel type. In the quiescent state the output lines of the decode circuits are clamped to ground to assure that substantially no power is dissipated. When the decoder system is in the select state, the output lines of the unselected decode circuits remain clamped to ground. The circuit has the advantage that it requires only a pair of cascoded switches plus a strobe switch connected in series with the data switches for operation. This results in a considerable savings of the devices required over prior art decode circuits of this type.

2 Claims, 2 Drawing Figures

DECODE CIRCUIT

BACKGROUND OF THE INVENTION

1. Field of the Invention

This invention relates to a decoder circuit allowing the selective application of drive pulses from a drive circuit to a memory. More particularly, it relates to a decode circuit fabricated from complementary field effect transistor devices and is therefore capable of being fabricated in integrated circuit form.

2. Description of the Prior Art

In recent years there has been a marked switch in integrated circuit manufacture from the almost total usage of bipolar circuits to field effect transistors. The field effect transistor can be fabricated in fewer process steps and increased package density than a corresponding bipolar circuit. However, the field effect transistor is generally slower than the bipolar device and there have been problems with reliability and yield in the manufacturing process which have impeded the large scale introduction of field effect transistor circuits into commercial products.

Recent advances in clean processing and in the understanding of the basic nature of the field effect transistor have reduced the reliability problem considerably. With regard to improved operating speed, the most significant development has been the complementary-metal-oxide-semiconductor (CMOS) transistor structure in which both P and N channel transistors are fabricated in the same integrated circuit structure. CMOS circuits, as they are called, are characterized by micropower quiescent operation, moderately fast propagation delay, excellent noise immunity and operation from a single power supply over a wide voltage range.

For these reasons, designers in the semiconductor art have begun to take advantage of complementary field effect transistor technology to design an ever increasing number of digital circuits, both logic and memory, in complementary FET form.

There have been a number of decoding circuits designed with P and N channel transistors, some of which have achieved a degree of commercial success. However, the advantages of complementary devices are often offset by the introduction of added delays in the circuit from the receipt of the input pulses to the generation of an output pulse to drive the memory location selected; in addition, the number of devices required for each decoder is relatively large compared to competing technologies. This factor is particularly acute, considering the number of decode circuits required for a moderately sized memory. For example, in a 64 by 64 memory, containing around 4,000 bit locations. 128 decode circuits are required. Thus, if only one device per decode circuit can be eliminated, substantial savings result in the cost of the memory package.

SUMMARY OF THE INVENTION

It is therefore an object of my invention to reduce the number of devices required in decoders fabricated from complementary field effect transistors.

This object and others are achieved by providing cascaded (series-connected) switches of one channel type for data and strobing and a pair of cascoded (parallel-connected) switches of the opposite channel type. In the quiescent state the output lines of the decode circuits are clamped to ground to assure that substantially no power is dissipated. When the decoder system is in the select state, the output lines of the unselected decode circuits remain clamped to ground. The circuit has the advantage that it requires only a pair of cascoded switches plus a strobe switch connected in series with the data switches for operation.

These and other features and advantages of my invention will be apparent from the following more particular description of the preferred embodiment of the invention as illustrated in the accompanying drawing.

DESCRIPTION OF THE PREFERRED EMBODIMENT

Although it is not contemplated that my invention be limited to particular types of transistors, my preferred embodiment employs N and P channel metal-oxide-semiconductor field effect transistors or silicon gate field effect transistors. A complete understanding of the fabrication and operation of such devices is presumably well known to those of skill in the semiconductor art. However, for those interested in a more basic explanation than will be provided hereafter, reference is made to the COS/MOS Integrated Circuits Manual published by the Solid State Division of RCA Corporation at Summerville, N.J. The 1972 and 1973 manuals are particularly instructive.

Figure 1:
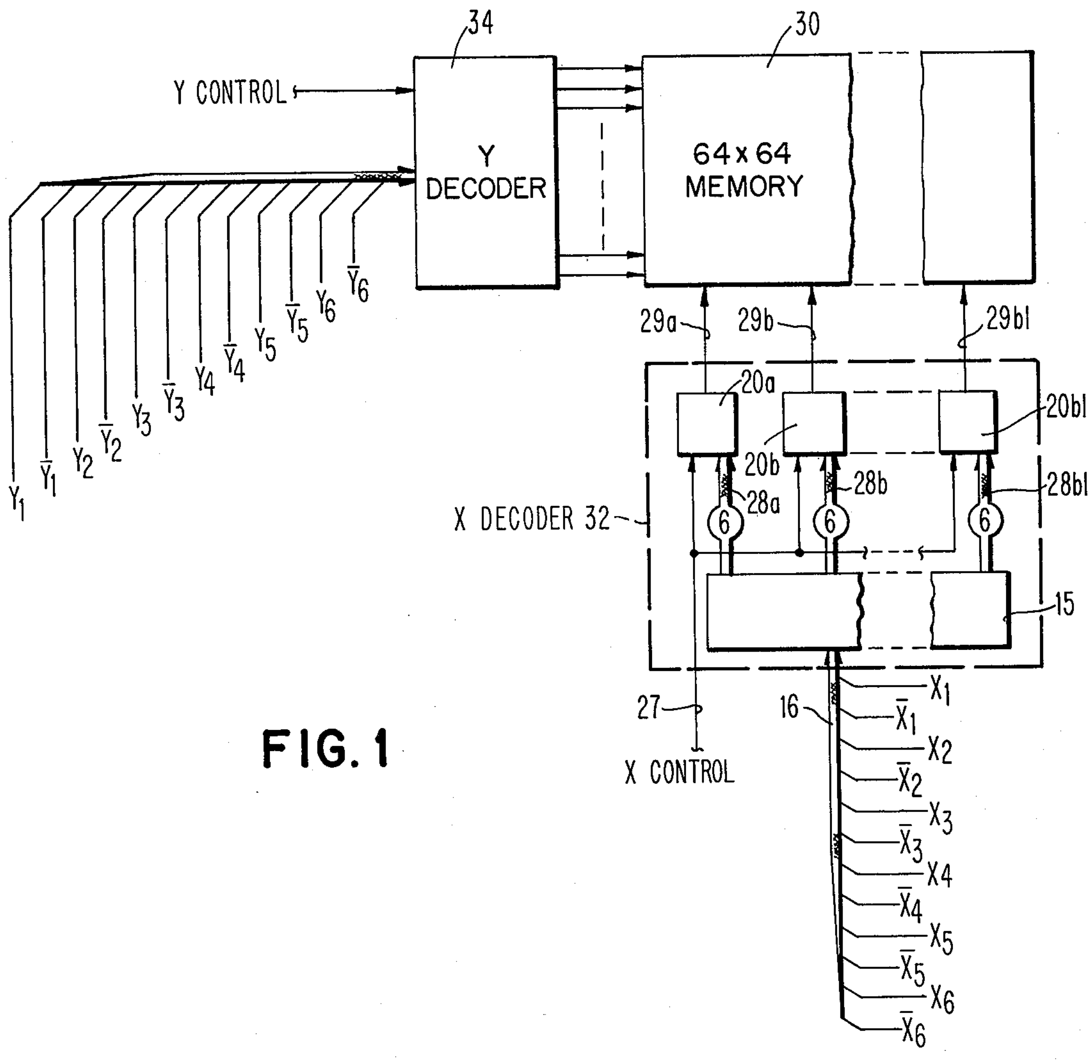
FIG. 1 is a block diagram of a known memory system in which my invention may be employed.

The storage system of FIG. 1, which is a common configuration in the present systems, includes a memory 30 which preferably consists of MOS devices. Illustrated is a high capacity 64 × 64 memory comprising a total of around 4,000 locations for storing binary indications of information. The standard system for addressing each individual location in the memory is to provide an X and Y line which, when simultaneously addressed, selects one and only one location. In the present system 64 lines from Y decoder 34 and 64 lines, denoted as 29*a*, 29*b* . . . 29*b*1 are provided from X decoder 32. As shown in FIG. 1 each decoder comprises a plurality of decode circuit stages denoted as 20*a*, 20*b* . . . 20*b*1, i.e., one for each drive line.

Each decode circuit 20 is addressed by six inputs shown on cables 28*a*, 28*b* . . . 28*b*1 and another input line which is common to all decoders denoted as X CONTROL 27 for strobing. Each decode circuit 20 is responsive to a different combination of input signals generated by a storage address register, not shown in the drawing. These register signals are then converted in a true/complement generator, also not shown, into true and complement signals denoted in the drawing as $X_1, \overline{X}_1, X_2, \overline{X}_2, X_3, \overline{X}_3, X_4, \overline{X}_4, X_5, \overline{X}_5, X_6, \overline{X}_6$ on cable 16. Different combinations of six of the twelve signal lines are run from signal block 15 through cabling 28*a*, 28*b*, . . . 28*b*1 to the particular decode circuits. For example stage 20*a* may receive signals from lines $X_1, X_2, \overline{X}_3, X_4, X_5, X_6$; stage 20b may receive the signals from $\overline{X}_1, X_2, X_3, X_4, X_5, X_6$; etc. with stage 20*b*1 receiving $\overline{X}_1, \overline{X}_2, \overline{X}_3, \overline{X}_4, \overline{X}_5, \overline{X}_6$. Thus, only one decode circuit out of the 64 in decoder 32 is activated at any given instant by the application of the six addressing signals on cable 16 and a strobe signal on X CONTROL line 27. Y decoder 34 operates in the same fashion.

Figure 2:
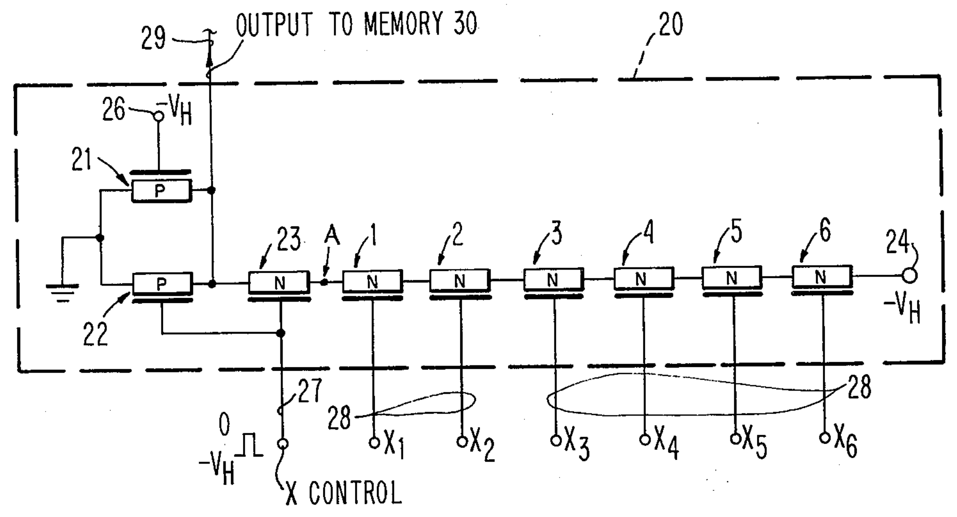
FIG. 2 is a circuit diagram of an embodiment of a decoder stage according to my invention.

Referring now to FIG. 2, there is shown a preferred embodiment of my invention. The decode circuit comprises a set of cascaded (series-connected) field effect transistors denoted as 1, 2, 3, 4, 5 and 6. In this embodiment the devices are N channel field effect transistors, preferably MOSFETs. The source terminal 6 is connected to a first power terminal 24 which has applied thereto a reference potential $-V_H$. The drain region of transistor 1 is connected at node A to the source terminal of transistor 23. Transistor 23 is also an N channel field effect transistor and is responsive to the X CONTROL signal on line 27. It will be recalled that the X CONTROL signal acts as a strobe for the entire memory system of FIG. 1. None of the decode circuits can be activated without the presence of the X CONTROL signal, which is common to all decode circuits. The drain terminal of transistor 23 is connected to the output line 29, which drives the selected locations in memory 30.

Circuit 20 also comprises a pair of cascoded transistors 21 and 22 of opposite channel type to the data transistors 1, 2, . . . , 6. In the preferred embodiment the cascoded transistors are P channel. The drain terminals of transistors 21 and 22 are connected in common with the drain terminal of transistors 23 to OUTPUT line 29. The source terminals of transistors 21 and 22 are connected to a second reference potential, which in this case is ground. The gate of transistor 22 is operated via X CONTROL 27; and the gate of transistor 21 is connected at terminal 26 to a third reference potential.

In the preferred embodiment of my invention, $-V_H$ is connected at terminal 26 as well as at terminal 24, thereby allowing operation of the circuit with only a single power supply. However, this arrangement is not necessary and different potentials could be connected at terminals 24 and 26 if desired.

Transistor 21 is held conductive by the potential at terminal 26. However, its transconductance is much smaller than that of any of the N channel transistors, preferably by an order of magnitude. Thus, it presents a high impedance when decode circuit 20 is selected. From the standpoint of integrated circuit fabrication, transistor 21 would encompass less area then the other devices and its gate width/length ratio would be smaller.

The invention will be completely understood by the following description of the operation of the circuit. Transistors 1, 2, 3, 4, 5 and 6 function as normally closed switches and are activated only by the receipt of signals on the corresponding input terminals $X_1$, $X_2$, $X_3$, $X_4$, $X_5$, $X_6$. For N channel devices, the data and strobe input signals would be at ground potential. As previously noted with respect to FIG. 1, the decode circuit 20 is activated only by the receipt of a combination of signals which activate simultaneously all of the devices 1–6 as well as transistor 23. Transistors 21 and 22 function as normally closed switches.

Transistor 21, being connected to a negative reference potential $-V_H$ at terminal 26, is always conductive, thereby clamping output line 29 to a ground potential when the decode circuit is unselected or when the decoder system 32 is inoperative. This function is especially important during the select period, i.e., when device 27 is turned on by the X CONTROL signal so as to render decoder 32 operative. Multiple selection of memory locations might be possible were it not for clamping the unselected decode circuits to ground via device 21.

When a particular decode circuit is selected, i.e., when devices 1–6 and 23 are turned on, the output 29 is at $-V_H$. The output level is actually determined by the ratio of the transconductances of P channel device 21 and the series-connected N channel devices. During the strobe period, i.e., when memory 30 of FIG. 1 is being addressed, X CONTROL 27 is at ground potential so that strobe transistor 23 is turned on and P channel device 22 is off.

When decoder system 32 is in the inoperative state, the potential at X CONTROL 27 is $-V_H$, which turns P channel transistor 22 on, thereby clamping the output line to ground through both P channel transistors 21 and 22. Because device 23 is turned off when device 22 is turned on, OUTPUT 29 is isolated from node A and no DC path exists to the output.

Upon the receipt of the appropriate signals at terminals $X_1$, . . . $X_6$ and a strobe pulse on line 27 the output line 29 is charged to about $-V_H$ through the series connected N channel devices. When the X CONTROL pulse on line 27 goes from ground potential to $-V_H$, thereby turning N channel device 23 off, device 22 turns on and the output potential discharges rapidly to ground through device 22. It is preferable that the output discharge rapidly to ground. For this purpose device 22 is preferably capable of handling a large current. Thus, when the circuits are fabricated in integrated circuit fashion, device 22 would comprise a larger area of the semiconductor than the other devices. As noted previously, the larger size of device 22 improves the circuit response appreciatively. Device 21 is relatively small and provides a higher impedance than the total impedance of the N channel devices when turned on.

In summary, I have invented a decode circuit which is fast and which uses very few devices. Its greatest advantages are realized in integrated circuit field effect transistors which include both the memory and the decoder on a single integrated circuit chip.

Although the invention has been described with a certain degree of particularity, it is understood that the present disclosure has been made only by way of example and that numerous changes in the details of construction, the combination and arrangement of parts, and the method of operation may be made without departing from the spirit and the scope of the invention as hereinafter claimed.

What is claimed is:

1. In a decoder for decoding multi-bit, parallel channel digital input signals into a plurality of single channel output signals for addressing a memory and including: a plurality of decode circuits, a plurality of input lines selectively connected to said decode circuits for operating a single decode circuit during a decode cycle and a control line for generating a signal determinative of the occurrence of said decode cycle, the improvement wherein each said decode circuit comprises:

a set of cascaded field effect transistors of a first channel type;

one of said transistors being rendered conductive by said control signal, the remainder of said transistors individually responsive to one of said input signals;

said set connected between a first reference potential and said decode circuit output line;

a pair of cascoded field effect transistors of a second channel type connected between said output line and a second reference potential;

said first cascoded field effect transistor being rendered non-conductive by said control signal;

said second cascoded transistor being held conductive by said first reference potential and exhibiting a low transconductance;

whereby said first reference potential is connected to said output during a decode cycle when all of said cascaded field effect transistors are operated by said input signals, and said output line is clamped to said second reference potential through said second cascoded transistor when said decode circuit is unselected.

2. A decoder as in claim 1 wherein said first cascoded transistor exhibits a large transconductance for rapidly discharging said output line when said cascaded transistors are rendered non-conductive.

* * * * *

UNITED STATES PATENT OFFICE

CERTIFICATE OF CORRECTION

PATENT NO. : 3,911,428

DATED : October 7, 1975

INVENTOR(S) William Benedict Chin

It is certified that error appears in the above-identified patent and that said Letters Patent are hereby corrected as shown below:

Column 3, Line 6 after "terminal" insert --of transistor--

Column 3, Line 44 after "area" delete "then" and insert --than--

Signed and Sealed this

*seventeenth* Day of *February 1976*

[SEAL]

*Attest:*

RUTH C. MASON
*Attesting Officer*

C. MARSHALL DANN
*Commissioner of Patents and Trademarks*